United States Patent [19]
Lien

[11] Patent Number: 5,541,433
[45] Date of Patent: Jul. 30, 1996

[54] HIGH SPEED POLY-EMITTER BIPOLAR TRANSISTOR

[75] Inventor: Chuen-Der Lien, Los Altos, Calif.

[73] Assignee: Integrated Device Technology, Inc., Santa Clara, Calif.

[21] Appl. No.: 400,649

[22] Filed: Mar. 8, 1995

[51] Int. Cl.[6] .......................... H01L 29/76; H01L 29/94; H01L 31/062; H01L 31/113
[52] U.S. Cl. ........................... 257/378; 257/370; 257/374
[58] Field of Search .................................. 257/375, 370, 257/374

[56] References Cited

U.S. PATENT DOCUMENTS

| | | | |
|---|---|---|---|
| 4,486,942 | 12/1984 | Hirao | 257/378 |
| 5,008,210 | 4/1991 | Chiang et al. | 257/370 |
| 5,416,351 | 5/1995 | Ito et al. | 257/357 |
| 5,448,087 | 9/1995 | Streit et al. | 257/198 |

*Primary Examiner*—Stephen D. Meier
*Attorney, Agent, or Firm*—Skjerven, Morrill, MacPherson, Franklin & Friel

[57] ABSTRACT

Spacers are formed on the inside walls of a narrow silicon loss trench of a poly-emitter type bipolar transistor structure so that at most a narrow strip on the bottom of the trench receives high concentration doping when an extrinsic base region of the bipolar transistor is being doped. The narrowness of the exposed silicon surface which is etched to form the silicon loss trench slows vertical etching and thereby facilitates the formation of a shallow trench. The narrowness of the strip on the bottom of the trench which receives high concentration doping causes slow vertical diffusion of dopants. As a result, the highly doped link region which extends downward from the bottom of the trench does not extend downward much farther than the base region. A high cutoff frequency is therefore achievable by reducing the distance between the bottom of the base region and the top of the buried layer without decreasing the base-to-collector breakdown voltage.

11 Claims, 8 Drawing Sheets

Bipolar

FET

Bipolar

FET

HIGH SPEED POLY-EMITTER BIPOLAR TRANSISTOR

FIELD OF THE INVENTION

This invention relates to bipolar transistors. More particularly, this invention relates to bipolar transistors of a BiCMOS device.

BACKGROUND INFORMATION

FIG. 1 (Prior Art) is a simplified cross-sectional diagram of an NPN bipolar transistor 1. When transistor 1 is conducting current, current flows from collector electrode 2, through N+ type sinker region 3, through N+ type buried layer 4, through N− type collector region 5, through P type base region 6, through N+ type emitter region 7, and to emitter electrode 8. The arrow labeled $\bar{e}$ points in the opposite direction because electron flow is defined to be opposite of current flow. N+ type buried layer 4 and N+ type sinker region 3 form a low resistance connection from the bottom surface of N− type collector region 5 to collector electrode 2. A base current flows from base electrode 9, through low impedance N+ type base contact region 10, through P type base region 6, through N+ type emitter region 7, and to emitter electrode 8. The arrow labeled + indicates that current conduction in the base region is primarily due to the movement of holes. The transistor structure is formed on a P type substrate 11. Field oxide 12 is formed around the active area which contains the emitter and base regions.

A bipolar transistor generally should have a thin base region so that its $\beta$ ($\beta = I_C/I_B$) will be high. In the structure of transistor 1, however, the thickness of the base region 6 underneath the emitter region 7 should not be made significantly thinner than the thickness of the emitter region 7 because the magnitude of the variations in the thickness of the implanted and diffused emitter region 7 increases as the thickness of the emitter region 7 increases. An emitter region which is much thicker than the underlying base region may therefore have variations which are of significant magnitude when compared to the thickness of the thin base region. Consistent base thicknesses in all the bipolar transistors on a die may therefore be difficult to achieve.

FIG. 2 (Prior Art) is a simplified cross-sectional diagram of another type of NPN bipolar transistor 13 called a "poly-emitter" transistor. The poly-emitter type bipolar transistor is generally suited for fabrication on the same die with field effect transistors in a BiCMOS process. To form bipolar transistor 13, a buried N+ type layer 14 is formed in a P- type substrate 15 by ion implanting N type dopants and a subsequent anneal to repair damage to the crystal structure caused by the implant. An N− type epitaxial silicon layer is then grown over the N+ type buried layer to form upper surface 16. Using different masks and different dopants, N wells are formed for P channel field effect transistors on the die and P wells are formed for the N channel field effect transistors on the die. When the N wells are being formed, N type dopants also dope the portion of the epitaxial silicon which will ultimately form an N− type collector region 17 of the bipolar transistor 13. Field oxide 18 is then grown around the active area of the bipolar transistor using a LOCOS process. An N+ type implant is performed to form an N+ type sinker (not shown) for connecting a collector electrode (not shown) to the N+ type buried layer 14.

A gate oxide for the field effect transistors is then formed over the epitaxial silicon surface 16 and a mask is used to selective etch away the portion of this gate oxide which is in the active area of bipolar transistor 13. P type dopants are then selectively implanted in the bipolar transistor active area thereby doping the epitaxial silicon which will form an intrinsic base region 19.

A layer 20 (see FIGS. 3A and 3B) of polysilicon is then deposited and doped and a layer 21 of silicide is optionally formed over the polysilicon. Not only will this doped polysilicon be fashioned to form the gates of the field effect transistors, but this doped polysilicon will also serve to supply dopants for forming the emitter region 22 of bipolar transistor 13.

FIGS. 3A and 3B (Prior Art) illustrate a photoresist mask 23 used for forming the gates of the field effect transistors and for forming the polysilicon emitter feature 28 of bipolar transistor 13. Note that thin gate oxide 24 is present in the field effect transistor structure but not in the bipolar transistor structure. The silicide layer 21, the polysilicon layer 20 and the gate oxide layer 24 is then etched.

FIGS. 4A and 4B (Prior Art) illustrate structures which result after etching. An overetch is performed to make sure that all polysilicon is removed. Because there is no gate oxide in the bipolar structure, etching proceeds past silicon surface 16 thereby forming a trench as illustrated in FIG. 4A. There is no such trench in the field effect transistor structure, however, because the gate oxide 24 slows the etching as illustrated in FIG. 4B.

In a lightly doped drain (LDD) field effect transistor process, the P channel field effect transistor active areas and the bipolar active areas receive a light P− type blanket implant and the N channel field effect transistor active areas receive a light N− type blanket implant. An oxide is then formed over the entire wafer and the oxide is etched so that oxide spacers 25 are formed at the edges of the gates and at the edges of the polysilicon emitter feature 28 of the bipolar transistor 13.

With relatively lightly doped regions 26 underneath the spacers 25, the P channel field effect transistor active areas and the bipolar active areas receive a more heavy P+ type blanket implant and the N channel field effect transistor active areas receive a more heavy N+ type blanket implant. Accordingly, heavily doped extrinsic base regions 27 are formed outside the lightly doped regions 26 in the bipolar transistor active area.

The bipolar transistor of FIG. 2 generally has an increased $\beta$ when compared with the $\beta$ of the structure of FIG. 1. One possible explanation is that the polysilicon emitter feature 28 to emitter region 22 boundary impedes the movement of holes. Because the base current is a current which flows from P+ type extrinsic base region 27, through lightly doped P− type link region 26, through intrinsic base region 19, through N+ type emitter region 22 and through N+ type polysilicon emitter feature 28 to an emitter electrode (not shown), impeding the movement of holes at the polysilicon boundary reduces the base current $I_B$. Because $\beta$ is the collector current $I_C$ divided by the base current $I_B$, the $\beta$ of the transistor is increased.

FIG. 5 (Prior Art) is a top down view showing the boundary 29 of the base implant mask used to remove gate oxide from the bipolar transistor active area and used to implant P type dopants into intrinsic base region 19. Solid line 30 illustrates the boundary of the actual active area. Solid line 31 illustrates the top down outline of the polysilicon emitter feature 28. FIG. 2 is a cross-sectional diagram taken along line BB of FIG. 5 whereas FIG. 6 is a cross-sectional diagram taken along line CC of FIG. 5. As shown in FIG. 6 (Prior Art), oxide spacers 25 in FIG. 2 and oxide spacers 25 in FIG. 6 are actually different cross-sectional views of the same single spacer which surrounds the periphery of the polysilicon emitter feature 28.

Not only is it generally desirable to have a high β, but it also generally desirable for the transistor to have a high cutoff frequency $f_T$. Decreasing the resistance $r_c$ in the collector current path between the intrinsic base region 19 and the buried layer 14 increases the cutoff frequency $f_T$ of the transistor. It therefore would be desirable to bring the bottom of P type intrinsic base region 19 closer to the top of buried layer 14 so that electrons would pass through less relatively resistive N− type collector region silicon on their path to buried layer 14. Doing so, however, may result in a transistor which has an undesirably low base-to-collector breakdown voltage ($BV_{cbo}$). The lowest extent of the extrinsic base region 27 determines the minimum distance D1 between the bottom of the transistor base and the top of the buried layer 14. This minimum distance determines the base-to-collector voltage at which the transistor will breakdown. The depth of extrinsic base region 27 therefore generally limits how close the bottom of P type base region 19 can be brought to the top of buried layer 14 for a required base-to-collector breakdown voltage.

A bipolar transistor structure is therefore sought which can be manufactured on the same die as field effect transistors, which has an adequately high β, which has an adequately high cutoff frequency $f_T$, and which has an adequately high base-to-collector breakdown voltage.

SUMMARY

Embodiments are disclosed in which spacers are formed on the inside walls of a narrow silicon loss trench of a poly-emitter type bipolar transistor so that only a narrow strip on the bottom of the trench receives high concentration doping when an extrinsic base region of the bipolar transistor is being doped. The narrowness of the exposed silicon surface which is etched to form the trench slows vertical etching and thereby facilitates the formation of a shallow trench. The narrowness of the strip on the bottom of the trench which receives high concentration doping slows the vertical diffusion of dopants. As a result, the highly doped link region which extends downward from the bottom of the trench does not extend downward much farther than the intrinsic base region. A high cutoff frequency $f_T$ is therefore achievable by reducing the distance between the bottom of the intrinsic base region and the top of the buried layer without decreasing the base-to-collector breakdown voltage $BV_{cbo}$.

In some embodiments, spacers are formed on the inside walls of the narrow trench such that the spacers meet and no highly doped link region is formed. In some embodiments, the polysilicon of the polysilicon emitter feature of the bipolar transistor is deposited in the same BiCMOS deposition step as the polysilicon gates of P-channel and N-channel field effect transistors of a digital logic element. Other methods and structures are also disclosed.

BRIEF DESCRIPTIONS OF THE DRAWINGS

DETAILED DESCRIPTION OF THE PREFERRED EMBODIMENTS

Figure 7:
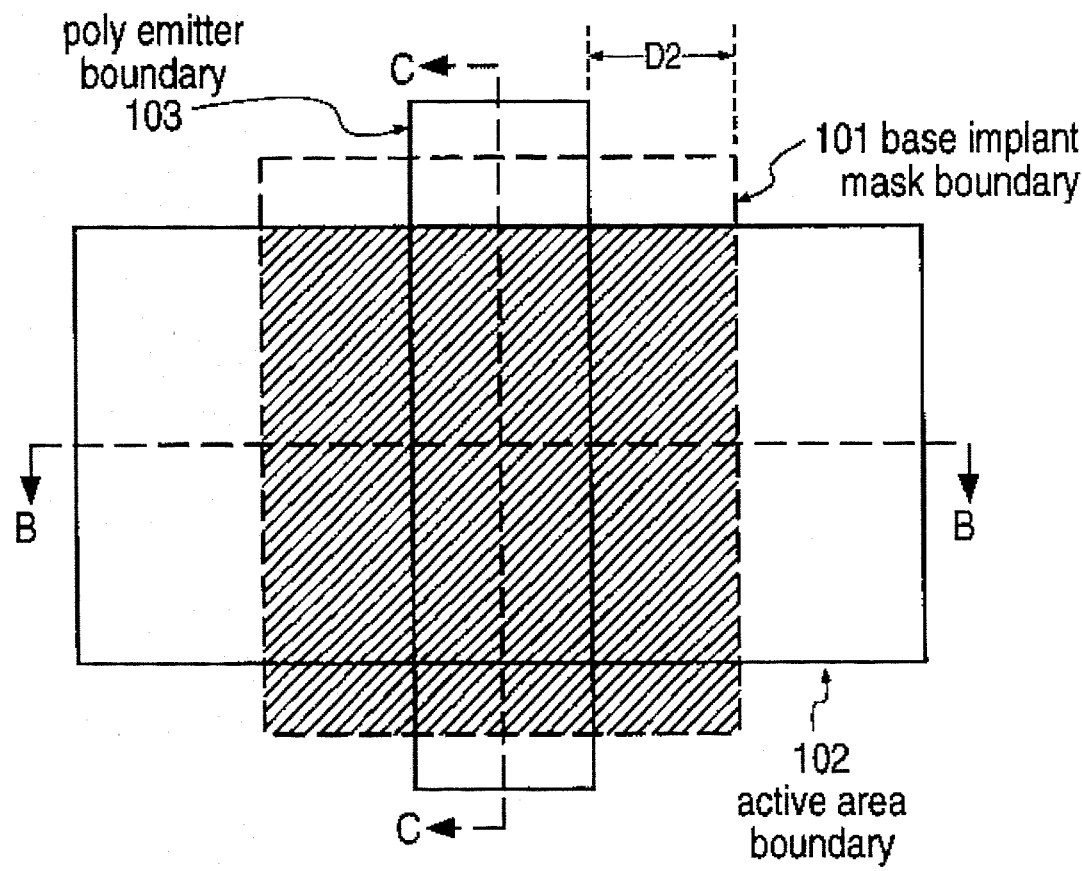
FIG. 7 is a top-down view of a poly-emitter bipolar transistor structure in accordance with an embodiment of the present invention.

FIG. 7 is a top-down view of a bipolar transistor structure 100. Dashed line 101 indicates the boundary of a base implant mask used to remove gate oxide in the active region of the bipolar transistor and used to implant P type dopants to form the intrinsic base region 108 of the bipolar transistor. The boundary 102 of the active area is indicated as is the boundary 103 of the polysilicon emitter feature 109 of the bipolar transistor. The hashed areas indicate portions of the active region from which the gate oxide is etched using the base implant mask.

Figure 8:
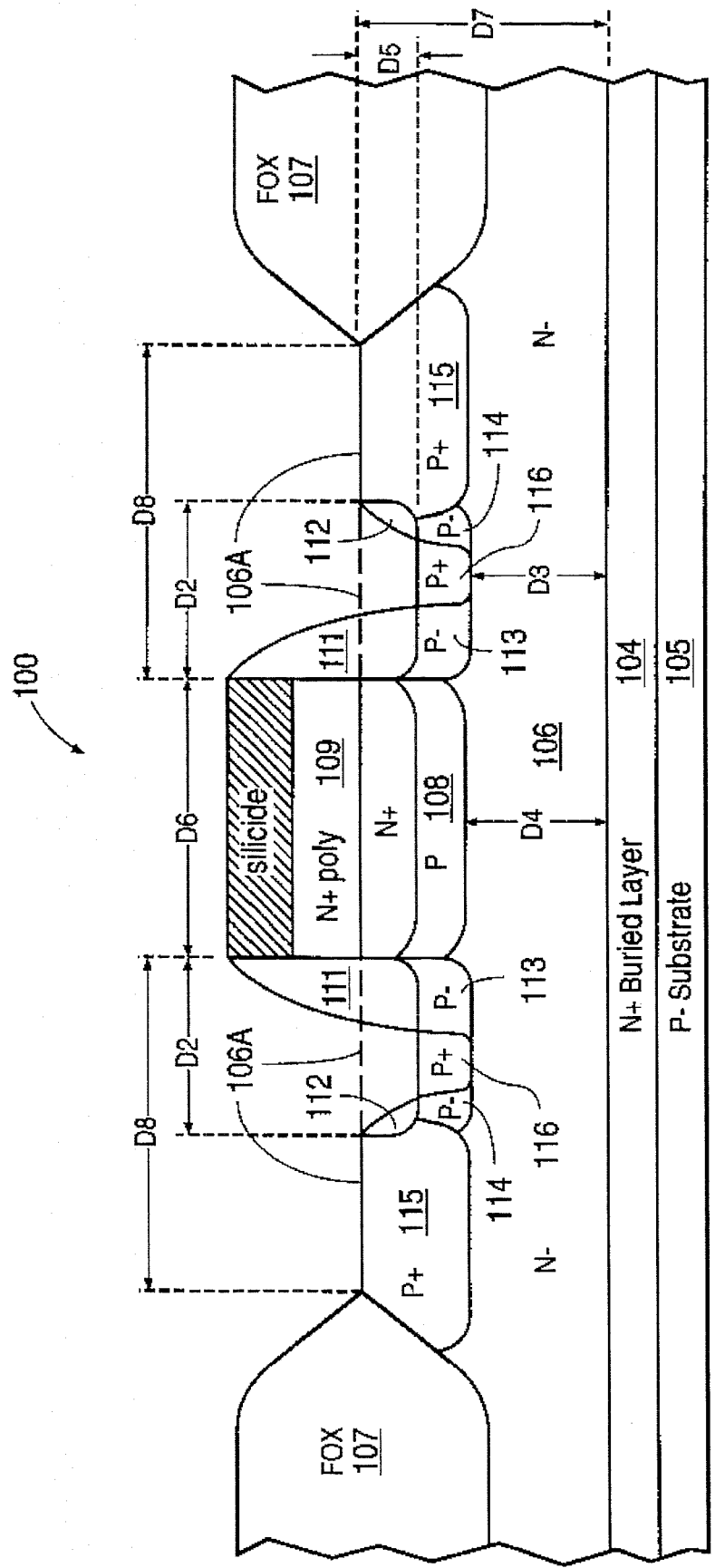
FIG. 8 is a simplified cross-sectional diagram taken along line BB of FIG. 7.

FIG. 8 is a simplified cross-sectional diagram of bipolar transistor structure 100 taken along line BB in FIG. 7. Certain parts of the structure such as overlying layers, the base electrode, the emitter electrode, the collector electrode and the sinker are omitted from the diagram in order to clarify the diagram. In some embodiments, bipolar transistor 100 is formed on the same die as P-channel and N-channel field effect transistors (not shown) in a BiCMOS process. An N+ type buried layer 104 is formed in P− type substrate 105 by ion implantation and a subsequent anneal. A layer of N− type epitaxial silicon is then grown on buried layer 104. Using different masks and different dopants, P wells are formed for P channel field effect transistors on the die and N wells are formed for the N channel field effect transistors on the die. When the N wells are being formed, N type dopants also dope the epitaxial silicon which will ultimately form an N− type collector region 106 of the bipolar transistor 100. Field oxide 107 is then grown around the active area of the bipolar transistor using a LOCOS process. An N+ type implant is performed to form an N+ type sinker (not shown) at a location outside active area boundary 102 for connecting a collector electrode (not shown) to the N+ type buried layer 104. A thin gate oxide is then grown on the upper surface 106A of the epitaxial silicon in both the field effect transistor areas as well as the bipolar transistor areas. Optionally a thin layer of polysilicon may be deposited over the gate oxide.

Using what is called a "base implant mask", the gate oxide is etched away from an exposed area indicated by the hashed area in FIG. 7. Gate oxide therefore remains in the portions of the bipolar transistor active area which are not indicated with hashing in FIG. 7. The base implant mask is also used to implant P type dopants into the part of the epitaxial silicon which will later form intrinsic base region 108.

A layer of polysilicon is then deposited over the entire die and the polysilicon is doped with N type dopants. An optional layer of silicide may also be deposited over the polysilicon. The polysilicon and silicide layers are then masked and reaction ion etched to form polysilicon emitter feature 109 and silicide feature 110. During the etching step, significant silicon loss occurs in the areas of the active area adjacent the polysilicon emitter feature. A narrow "silicon loss trench" of width D2 is therefore formed along each of the two parallel edges of polysilicon emitter feature 109 in the active area. In contrast, there is little silicon loss from the other part of the active area from which the gate oxide had not been removed earlier.

Figure 1:
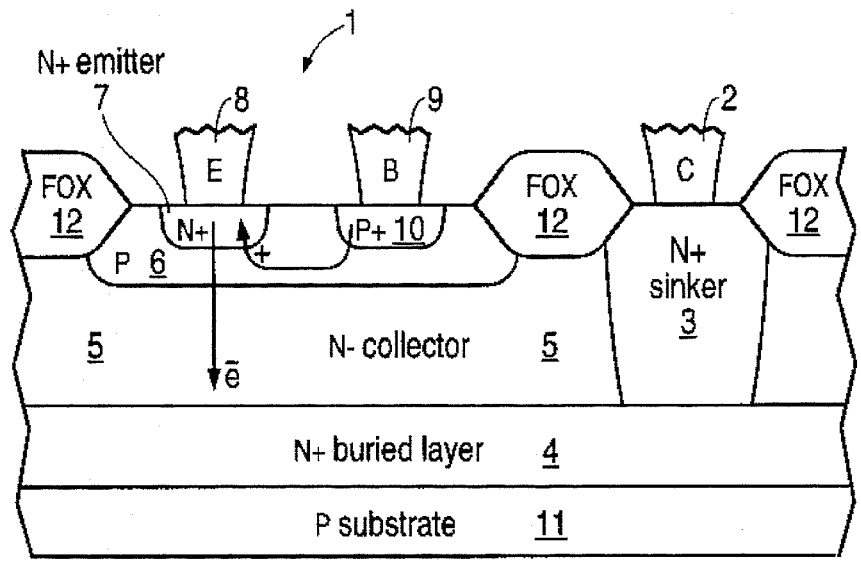
FIG. 1 (Prior Art) is a simplified cross-sectional diagram of an NPN bipolar transistor.
Figure 3A:
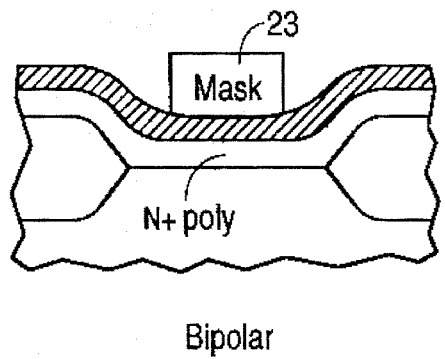
FIGS. 3A and 3B (Prior Art) illustrate a photoresist mask used for simultaneously forming the gates of field effect transistors and for forming the polysilicon emitter feature of a bipolar transistor.
Figure 3B:
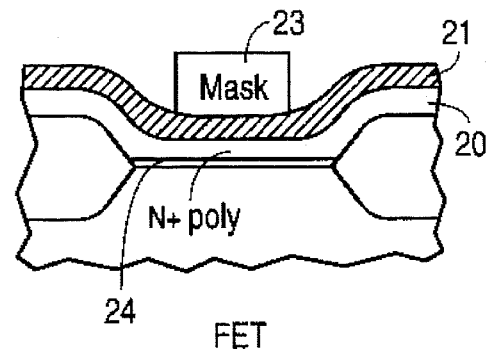
Figure 4A:
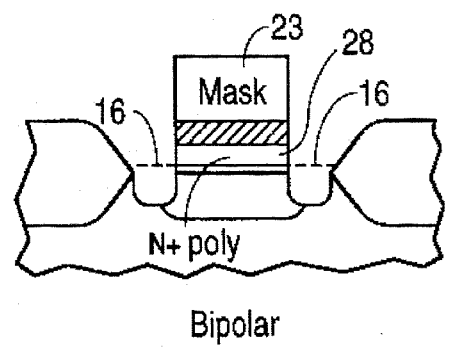
FIGS. 4A and 4B (Prior Art) illustrate structures which result after polysilicon overetching using the mask of FIGS. 3A and 3B.
Figure 4B:
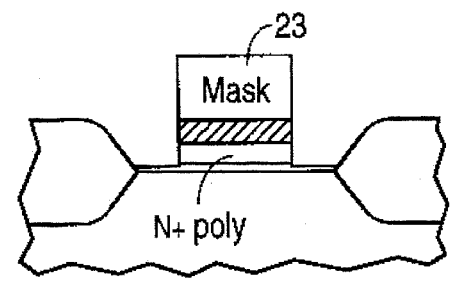
Figure 2:
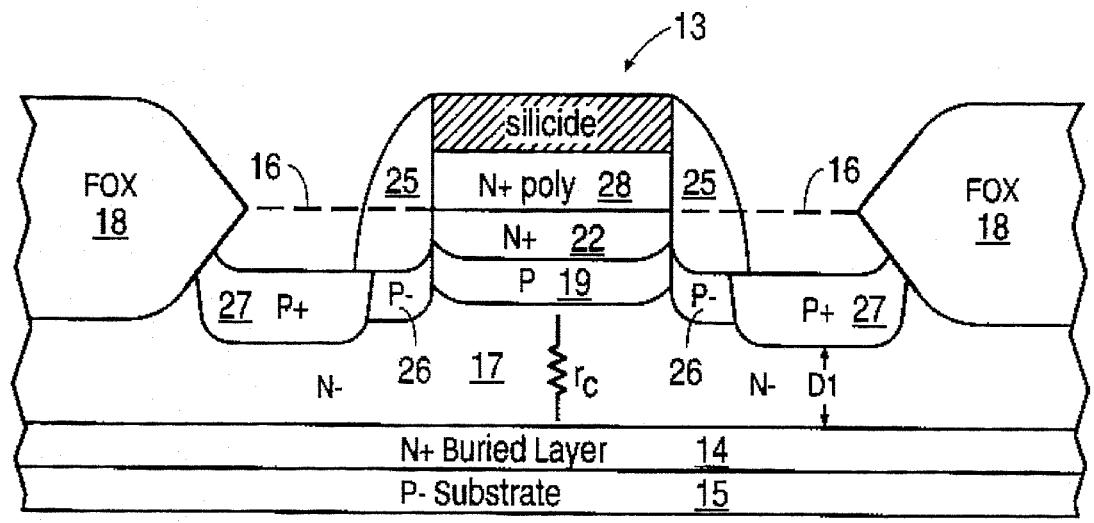
FIG. 2 (Prior Art) is a simplified cross-sectional diagram of a poly-emitter bipolar transistor.
Figure 6:
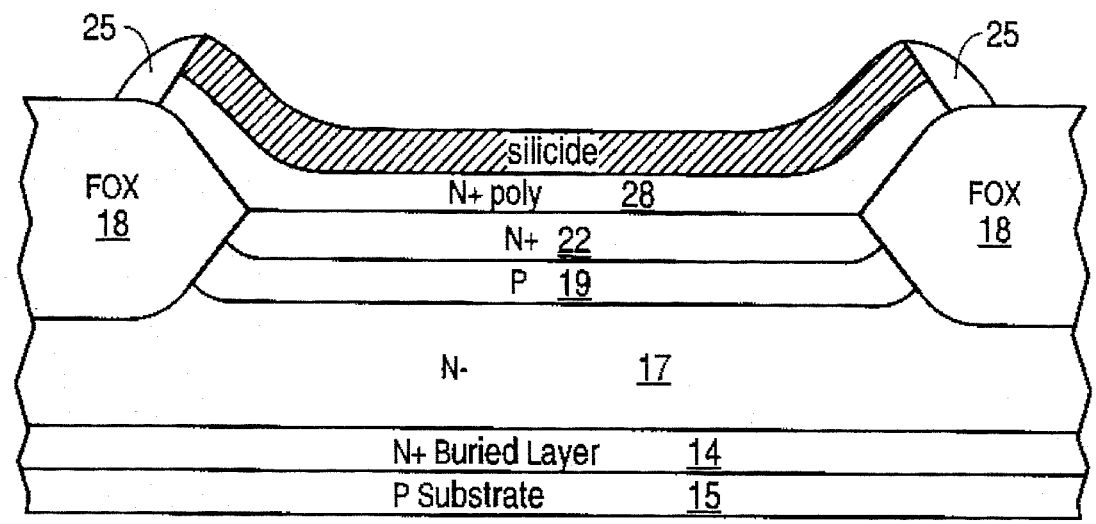
FIG. 6 (Prior Art) is a cross-sectional diagram taken along line CC of FIG. 5.
Figure 5:
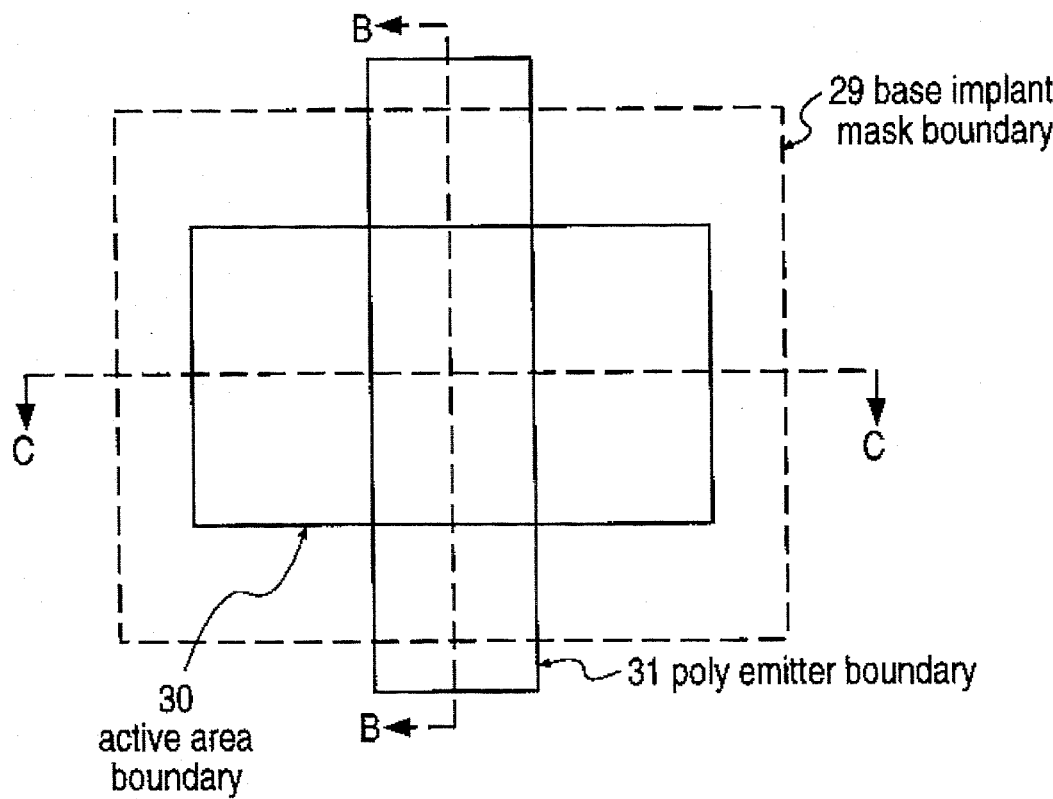
FIG. 5 (Prior Art) is a top down view showing the boundaries of a base implant mask versus the boundaries of an active area and a polysilicon emitter feature of a poly-emitter transistor structure.

The silicon loss trench can be made shallow in comparison to the wider area of silicon loss in the structure of FIG. 2. Reactive ion etching tends not to etch downward into silicon as rapidly when such etching must occur through a narrow opening as when a wider opening is provided. The narrowness of the silicon loss trench of FIG. 8 therefore reduces the depth of the trench under given etching conditions.

Next the P channel field effect transistor active areas and the bipolar active areas receive a light P– type blanket implant and the N channel field effect transistor active areas receive a light N– type blanket implant. An oxide is then formed over the entire wafer and the oxide is etched so that oxide spacers are formed at the peripheries of the gates of the field effect transistors and so that oxide spacers 111 are formed at the periphery of the polysilicon emitter feature 109 of the bipolar transistor 100. Other oxide spacers 112 are also formed on the outside wall of each silicon loss trench. Spacer materials other than oxide may be used in some embodiments.

With relatively lightly doped regions 113 and 114 underneath the spacers 111 and 112, respectively, the P channel field effect transistor active areas and the bipolar active areas receive a more heavy P+ type blanket implant. The N channel field effect transistor active areas receive a more heavy N+ type blanket implant. Accordingly, heavily doped extrinsic base regions 115 are formed outside the silicon loss trenches in the bipolar transistor structure. Furthermore, only a very narrow strip of the bottom of each silicon loss trench is implanted with P type dopants.

Because dopants in a narrow strip of silicon tend to diffuse downward less rapidly than do dopants in a wider strip, the P type dopants form relatively shallow P+ type regions 116 at the bottom of the trenches. As a result of the reduced depth of the silicon loss trenches and as a result of the shallow depth of P+ type regions 116, the distance D3 between the bottom of P+ type regions 116 and the top of buried layer 104 is made close to the distance D4 between the bottom of the base region 108 and the top of buried layer 104. Accordingly, the distance D4 can be reduced and the cutoff frequency $f_T$ of the transistor increased while maintaining an adequately high base-to-collector breakdown voltage.

Figure 9:
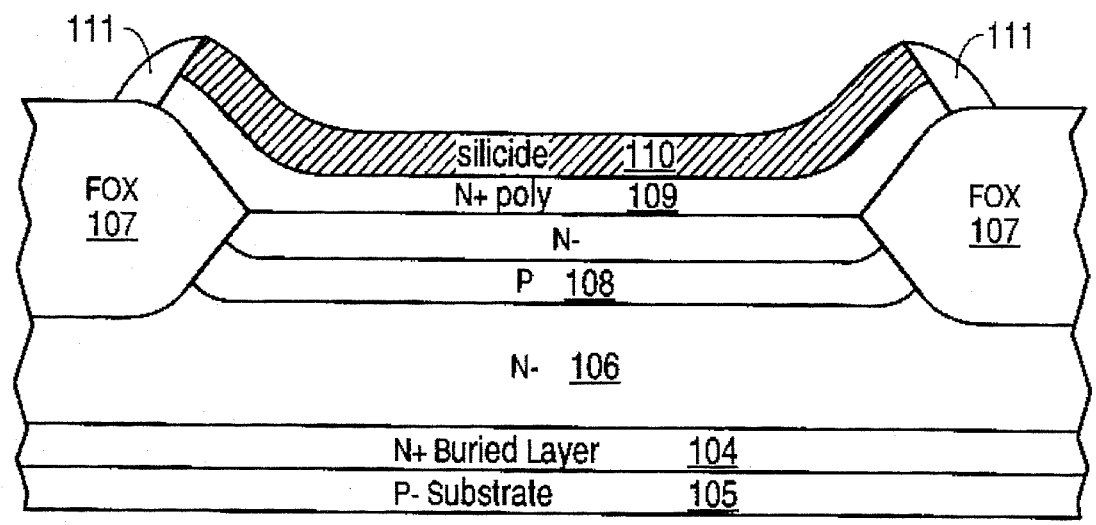
FIG. 9 is a simplified cross-sectional diagram taken along line CC of FIG. 7.

FIG. 9 is a cross-sectional diagram of bipolar transistor 100 taken along line CC in FIG. 7. In one embodiment of FIG. 8, D2 is approximately 50–5000 Å, D3 is approximately 500–3000 Å, D4 is approximately 500–3000 Å, D5 is approximately 1000–4000 Å, the thickness of the silicide 100 is approximately 100–3000 Å, the thickness of polysilicon emitter feature 109 is approximately 1000–4000 Å, the depth of the N+ type emitter region is approximately 500–2000 Å, the intrinsic base width D6 is approximately 1000–3000 Å, the final thickness of the epitaxial silicon D7 is approximately 4000–10,000 Å, and the extrinsic base width D8 is approximately 1000–4000 Å. The final thickness D7 of the epitaxial silicon was reduced 0.15 microns over the thickness of epitaxial silicon used in the structure of FIG. 2 while a base-to-collector breakdown voltage of greater than 10 volts was maintained. Using the same epitaxial silicon thickness, the base-to-collector breakdown voltage can be improved from 10 volts to 15 volts in accordance with the present invention. The dopant concentrations of the various regions of the bipolar transistor structure are not critical and can be varied. The poly-emitter bipolar transistor of FIG. 8 may be incorporated into a standard lightly doped drain BiCMOS process where the bipolar transistors are the poly-emitter type. In some embodiments, the silicon loss trenches are so narrow and the spacers so wide that no regions 116 are formed.

Figure 10:
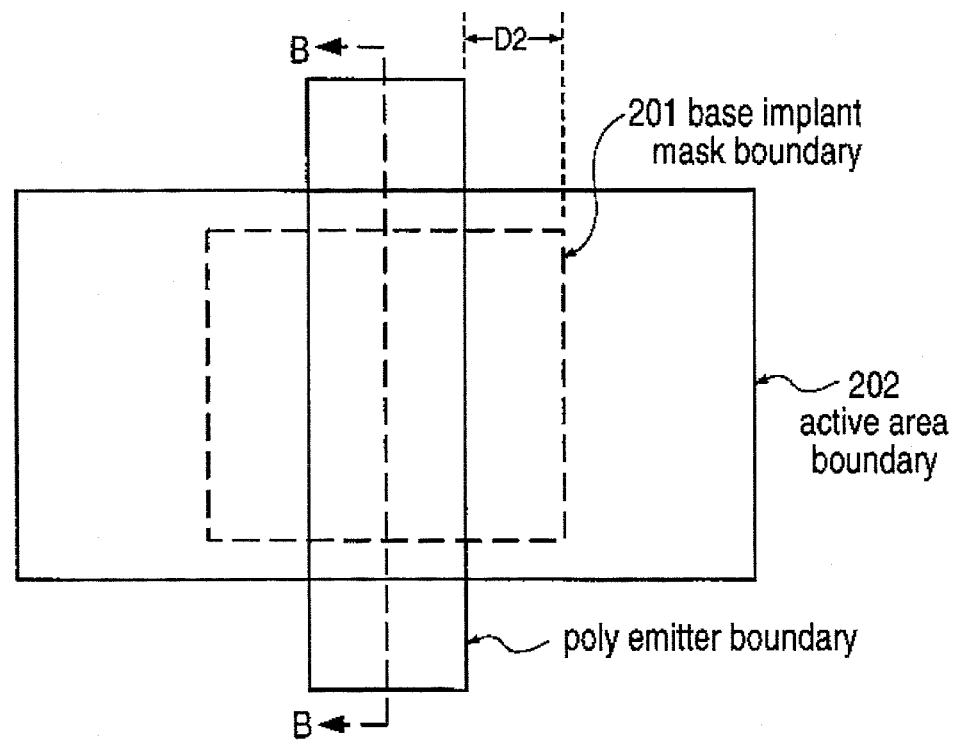
FIG. 10 is a top-down view of a transistor structure in accordance with another embodiment of the present invention.
Figure 11:
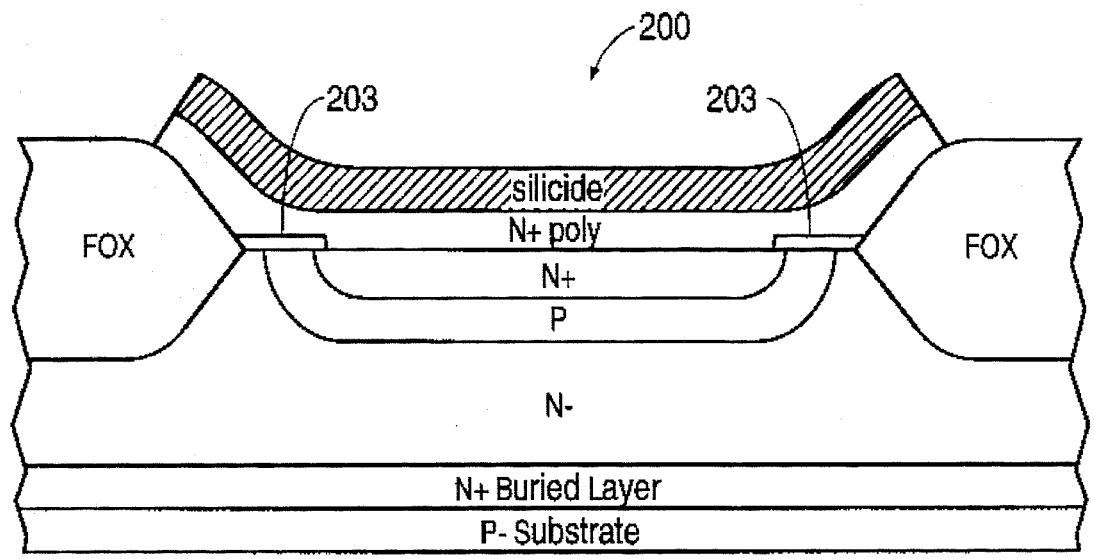
FIG. 11 is a simplified cross-sectional diagram taken along line BB of FIG. 10.

FIG. 10 is a top-down view of another poly-emitter bipolar transistor structure 200. The base implant mask boundary 201 is entirely contained within the active area boundary 202. FIG. 11 is a simplified cross-sectional diagram of transistor structure 200 taken along line BB of FIG. 10. Note the portions of gate oxide 203 remaining in the structure due to the smaller base implant mask opening. The structure of the transistor structure 200 in the dimension perpendicular to that of FIG. 11 is similar to that illustrated in FIG. 8.

As explained above, there are two masks used to remove gate oxide in the bipolar active area and to form the polysilicon emitter feature. The width of the base implant mask [D6+2(D2)] is therefore greater than the width of the polysilicon emitter feature D6 so that a misalignment between the two masks used will not leave gate oxide under an edge of the polysilicon emitter feature. The present invention is however not limited to embodiments wherein there is not gate oxide under the polysilicon emitter feature.

Figure 12:
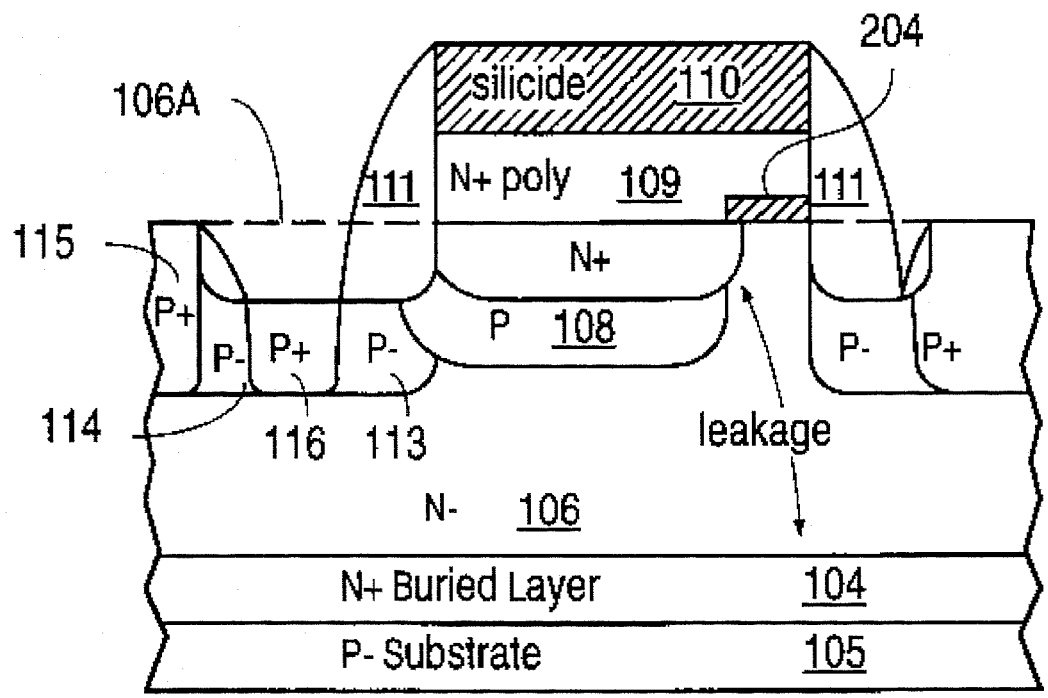
FIG. 12 is simplified cross-sectional diagram illustrating a bipolar transistor having a strip of gate oxide under an edge of the polysilicon emitter feature in accordance with an embodiment of the present invention.

FIG. 12 is a simplified cross-sectional diagram illustrating a poly-emitter bipolar transistor in accordance with the present invention in which a strip of gate oxide 204 is disposed under an edge of polysilicon emitter feature 109 due to mask misalignment. Although such a structure may have a higher base-to-collector resistance and may have greater collector-to-emitter leakage, such a transistor is nevertheless useful. The distance D2 for such a transistor may be as small as zero microns. Misalignment causes the trench on one side of the polysilicon emitter feature to be wider than the trench on the other side of the polysilicon emitter feature.

Although the present invention is described in connection with certain specific embodiments for instructional purposes, the invention is not limited thereto. Both NPN and PNP transistors can be realized. Various modifications, adaptations and combinations of various features of the various embodiments can be practiced without departing from the scope of the invention as set forth in the following claims.

What is claimed is:

1. An integrated circuit, comprising:
    a P-channel field effect transistor having a polysilicon gate;

an N-channel field effect transistor having a polysilicon gate, said P-channel and N-channel field effect transistors forming at least part of a digital logic element; and a polysilicon emitter type bipolar transistor having a base-to-collector breakdown voltage of at least 10 volts, having a cutoff frequency of at least 10 GH$_z$, and having a β of at least 50, a polysilicon emitter feature of said bipolar transistor having been deposited at the same time said polysilicon gates of said P-channel and N-channel field effect transistors were deposited.

2. Structure, comprising:

an emitter region of a first semiconductor type extending downward from an upper surface of an epitaxial layer of semiconductor material;

a polycrystalline emitter feature disposed on said emitter region, said polycrystalline emitter feature being of said first semiconductor type;

an intrinsic base region disposed underneath said emitter region, said intrinsic base region being of a second semiconductor type opposite said first semiconductor type;

an extrinsic base region extending downward from said upper surface of said epitaxial layer of semiconductor material, said extrinsic base region being of said second semiconductor type;

a trench formed in said epitaxial layer, said trench being disposed at least in part between said emitter region and said extrinsic base region; and a collector region disposed at least in part underneath said intrinsic base region, said collector region being of said first semiconductor type, wherein said trench is less than 200 Å in width.

3. The structure of claim 2, further comprising:

an insulating spacer in contact with at least a portion of said trench.

4. The structure of claim 3, further comprising:

a second insulating spacer in contact with at least another portion of said trench, said second insulating spacer contacting a sidewall of said extrinsic base region.

5. The structure of claim 3, further comprising:

a first link region of said second semiconductor type, said first link region extending downward from a surface of said trench; and a second link region of said second semiconductor type, said second link region extending downward from a surface of said trench, said second link region having a dopant concentration greater than a dopant concentration of said first link region.

6. The structure of claim 5, further comprising:

a buried layer of said first semiconductor type, a minimum distance D4 existing between said buried layer and a bottom portion of said intrinsic base region, a minimum distance D3 existing between said buried layer and a bottom portion of said second link region, wherein the difference between D4 and D3 is less than approximately 1000 Å.

7. Structure, comprising:

an emitter region of a first semiconductor type extending downward from an upper surface of an epitaxial layer of semiconductor material;

a polycrystalline emitter feature disposed on said emitter region, said polycrystalline emitter feature being of said first semiconductor type;

an intrinsic base region disposed underneath said emitter region, said intrinsic base region being of a second semiconductor type opposite said first semiconductor type:

an extrinsic base region extending downward from said upper surface of said epitaxial layer of semiconductor material, said extrinsic base region being of said second semiconductor type;

a trench formed in said epitaxial layer, said trench being disposed at least in part between said emitter region and said extrinsic base region; and a collector region disposed at least in part underneath said intrinsic base region, said collector region being of said first semiconductor type, wherein said structure is a bipolar transistor having a base-to-collector breakdown voltage of at least 10 volts, a cutoff frequency of at least 10 GHz, and a β of at least 50.

8. The structure of claim 7, further comprising:

an insulating spacer in contact with at least a portion of said trench.

9. The structure of claim 8, further comprising:

a second insulating spacer in contact with at least another portion of said trench, said second insulating spacer contacting a sidewall of said extrinsic base region.

10. The structure of claim 9, further comprising:

a first link region of said second semiconductor type, said first link region extending downward from a surface of said trench; and a second link region of said second semiconductor type, said second link region extending downward from a surface of said trench, said second link region having a dopant concentration greater than a dopant concentration of said first link region.

11. The structure of claim 10, further comprising:

a buried layer of said first semiconductor type, a minimum distance D4 existing between said buried layer and a bottom portion of said intrinsic base region, a minimum distance D3 existing between said buried layer and a bottom portion of said second link region, wherein the difference between D4 and D3 is less than approximately 1000 Å.

\* \* \* \* \*